United States Patent [19]

Yamada

[11] 4,389,661
[45] Jun. 21, 1983

[54] SOLID STATE IMAGE-SENSING DEVICE CAPABLE OF SHIFTING SIGNAL CHARGES TO A CHARGED TRANSFER REGION AT A HIGH SPEED

[75] Inventor: Tetsuo Yamada, Yokohama, Japan

[73] Assignee: Tokyo Shibaura Denki Kabushiki Kaisha, Kawasaki, Japan

[21] Appl. No.: 227,935

[22] Filed: Jan. 23, 1981

[30] Foreign Application Priority Data

Jan. 25, 1980 [JP] Japan ..................... 55-6990

[51] Int. Cl.³ ..................... H01L 29/78; G11C 19/28
[52] U.S. Cl. ......................... 357/24; 377/63
[58] Field of Search ................ 357/24 M, 24 LR; 307/221 D

[56] References Cited

U.S. PATENT DOCUMENTS 3,866,067  2/1975  Amelio ................... 357/24 LR
4,093,872  6/1978  Hartman et al. ........... 357/24 LR

FOREIGN PATENT DOCUMENTS 2753588  7/1978  Fed. Rep. of Germany ........ 357/24 LR

OTHER PUBLICATIONS

White et al., "A Multiple-Gate CCD-Photo Diode Sensor Element for Imaging Arrays", IEEE Trans. Electron Devices, vol. ED-25 (2/78), pp. 125-131.

*Primary Examiner*—Gene M. Munson
*Attorney, Agent, or Firm*—Finnegan, Henderson, Farabow, Garrett & Dunner

[57] ABSTRACT

A solid state image-sensing device which includes photoelectric conversion regions for generating charges in amounts corresponding to those of light received by the photoelectric conversion regions, a charge-storing region for storing the charges produced in the photoelectric conversion regions, a charge transfer region, and a charge-shift control region for controlling the transfer of a charge stored in the charge-storing region to the charge transfer regions. The solid state image-sensing device further includes a charge shifting region which is formed between the charge-storing region and photoelectric conversion regions to successively shift the charges generated in the photoelectric conversion regions to the charge-storing region.

4 Claims, 15 Drawing Figures

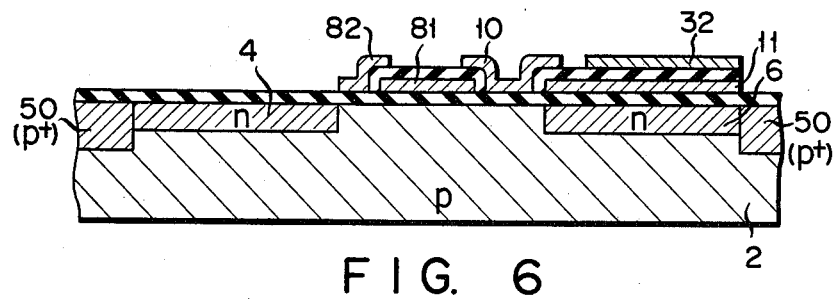
F I G. 6
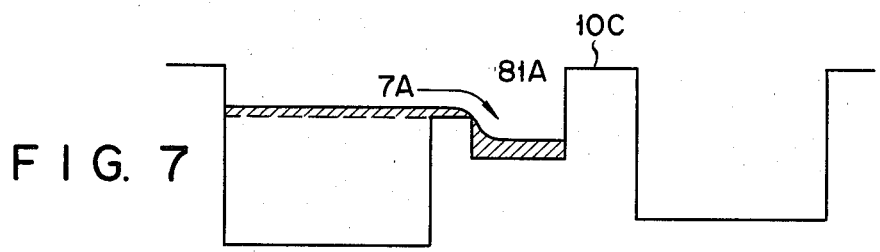
F I G. 7
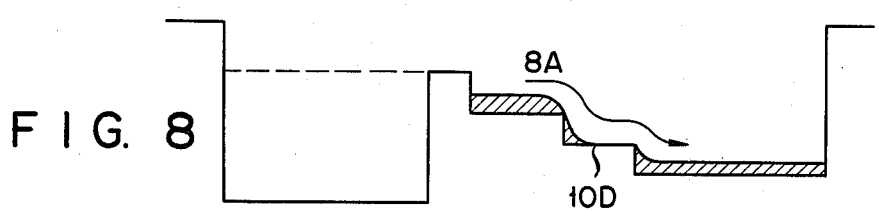
F I G. 8
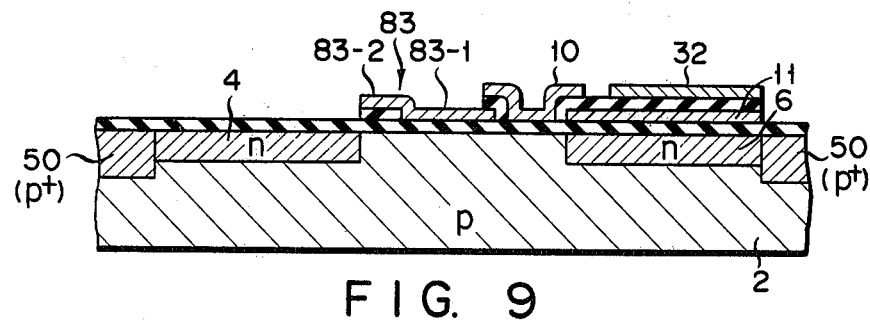
F I G. 9

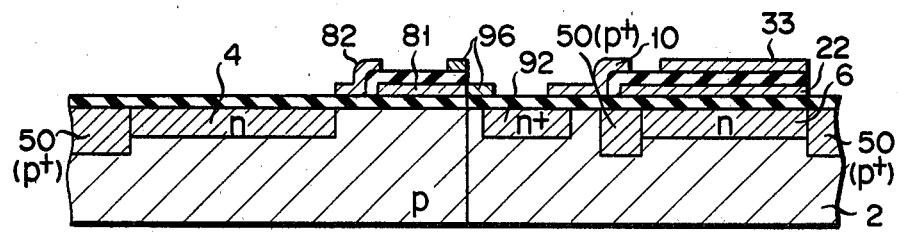
F I G. 13
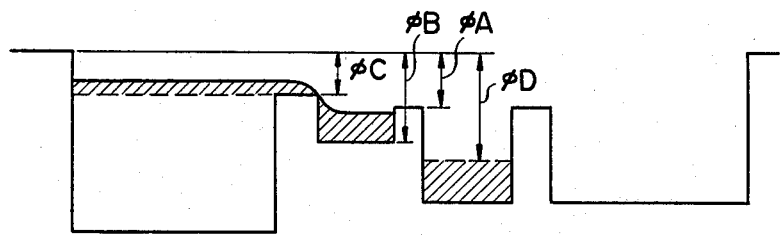
F I G. 14
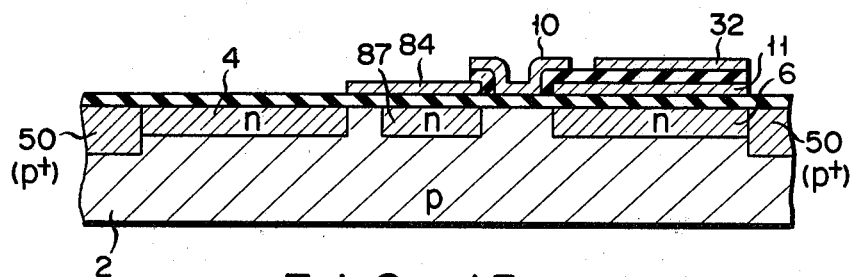
F I G. 15

SOLID STATE IMAGE-SENSING DEVICE CAPABLE OF SHIFTING SIGNAL CHARGES TO A CHARGED TRANSFER REGION AT A HIGH SPEED

This invention relates to a solid state image-sensing device.

In a conventional process for higher photosensitivity, particularly, sensitivity to a blue light of a solid state image-sensing device, a light is received by a photoelectric conversion element formed of a p-n junction type photodiode and converted into electric charges of an amount corresponding to that of the received light, and then the electric charges thus obtained are temporarily stored in a charge-storing region formed adjacent to the photoelectric conversion element. As schematically shown in FIGS. 1 and 2, a prior art solid state image-sensing device having the above-mentioned function includes p-n junction type photodiodes or photoelectric conversion sections 41 to 43 formed of, for example, n-type semiconductor regions 4 formed in parallel in the surface area of a p-type substrate 2; and an n-type charge transfer region 6 which is formed in the surface area of the substrate in a state spatially extending in parallel with the direction in which the photoelectric conversion sections 41 to 43 are arranged. As seen from FIG. 1, a charge-storing electrode 8 and charge-shift control electrode 10 extending in parallel with the direction in which the photoelectric conversion sections 41 to 43 are arranged and formed insulatively on that portion of the p-type substrate 2 which is defined between the photoelectric conversion sections 41 to 43 and charge transfer region 6. The conventional solid state sensing device further includes charge transfer electrodes 11 to 13 formed insulatively on the charge transfer region 6 respectively in alignment with the photoelectric conversion sections 41 to 43, charge transfer electrodes 21 to 24 arranged respectively alternately with the charge transfer electrodes 10 to 13, and charge transfer electrodes 31 to 36 which are respectively so arranged as to overlap the mutually facing sides of every two adjacent ones of the charge transfer electrodes 11 to 13 and 21 to 24. The charge transfer electrodes 11, 22, 12, 23, 13 and 24 are respectively electrically connected to the charge transfer electrodes 31 to 36 in the order mentioned. As indicated in hatchings in FIG. 1, a p-type region 50 is formed as a channel stop at a high concentration of an impurity in a suitable site to prevent a signal charge from leaking to a region outside a prescribed charge path.

Description is now given of the operation of the prior art solid state image-sensing device shown in FIGS. 1 and 2 with reference to FIGS. 3 and 4 indicating a potential profile.

In the charge-storing step, the charge-shift control electrode 10 is held at a substrate potential. The surface potential at that portion of the substrate 2 facing the charge-shift control electrode 10 is held at a level substantially equal to the surface potential of the channel stop region 50 as indicated in a solid line 10A in FIG. 3. In this state, the substrate and channel stop region 50 jointly constitute a barrier for confining a charge. As a result, charges produced in an amount corresponding to that of light received by the photoelectric conversion regions 41 to 43 are stored therein as well as in those portions of the surface region of the substrate 2 which lie adjacent to the photoelectric conversion regions 41 to 43 and below the charge-storing electrode 8. Charges or electrons, generated in the photoelectric conversion region 41 are stored, as shown in a hatching in FIG. 3, in the region 41 and also in that portion of the surface area of the substrate which lies adjacent to the region 41 and below the charge-storing electrode 8.

In the charge-shift step, the charge-shift control electrode 10 is impressed with a positive voltage higher than that which is supplied to the charge-storing electrode 8. As shown in a solid line 10B in FIG. 4, the potential of that portion of the surface of the substrate 2 which faces the charge-shift control electrode 10 is higher than the potential of that surface portion of the substrate 2 which faces the charge-storing electrode 8, and lower than the potential at the surface of the n-type charge transfer region 6. As a result, charges or electrons stored in the n-type semiconductor regions 4 and that portion of the surface of the substrate 2 which lies below the charge-storing electrode 8 are shifted to the charge transfer region 6 as indicated by an arrow 4A in FIG. 3. In other words, electrons produced in the photoelectric conversion regions 41 to 43 are respectively shifted to those portions of the charge transfer region 6 which lie below the electrodes 11 to 13. Where all the stored electrons are shifted to the charge transfer region 6, then depletion appears in that portion of the surface of the substrate 2 which faces the charge-storing electrode 8 impressed with a prescribed bias voltage. The surface potential of the substrate 2 is produced in accordance with the bias voltage. The surface potential of the substrate 2 causes the p-n junction type photodiode to be biased backward.

Where the voltage of the charge-shift control electrode 10 is brought back to the substrate potential, then the charge-storing step is commenced, causing charges or electrons shifted to the charge transfer region 6 to be transferred in parallel with the direction in which the electrodes 11 to 13, 21 to 23 and 31 to 35 are arranged, by selectively impressing bias voltages in the known manner to the electrodes 11 to 13, 21 to 23 and 31 to 35.

With such a conventional solid state image-sensing device as described above, a length of time required for a charge produced in the photoelectric conversion region to be shifted to the charge transfer region 6 is defined by a length of time required for a charge stored in the region most remote from the electrode 10 to be transferred to that portion of the surface of the substrate 2 which lies below the electrode 10. Accordingly, where charges have to be shifted in a relatively short time, that is, a positive voltage is impressed on the charge-shift control electroce 10 only for a short time, and where the n-type semiconductor region 4 is formed long, then part of the stored charges will not be shifted to the charge transfer region 6, but is left in the n-type semiconductor region 4. This event involves the difficulties that where part of a large amount of charges produced in a charge-storing step fail to be shifted to the charge transfer region 6 in a charge shifting step, and a light is not received in the succeeding charge-storing step, then the charges which fail to be shifted will be shifted to the charge transfer region 6 in the succeeding charge shifting step, giving rise to a sort of a phenomenon of a residual image.

It is accordingly the object of this invention to provide a solid state image-sensing device capable of shifting signal charges to a charge transfer region at a high speed regardless of an amount of a charge produced in a photoelectric conversion region.

To attain the above-mentioned object, this invention provides a solid state image-sensing device comprising a semiconductor substrate of one conductivity type, a photoelectric conversion section including at least one semiconductor region having the opposite conductivity type to that of the semiconductor substrate and formed in the surface area of the semiconductor substrate, a charge transfer section formed apart from the photoelectric conversion section, a charge-storing section formed spatially between the photoelectric conversion section and the charge transfer section, and including a second semiconductor region which is integrally formed with the first semiconductor region of the photoelectric conversion section with the opposite conductivity type to that of the semiconductor substrate, and a first electrode insulatively formed on the second semiconductor region, a charge-shifting section provided between the photoelectric conversion section and the charge-storing section to shift charges generated in the photoelectric conversion section to the charge-storing section, and including a third semiconductor region formed in the second semiconductor region in a position adjacent to the first semiconductor region with the same conductivity type as that of the semiconductor substrate, and a second electrode insulatively formed on the third semiconductor region and a electrical connection with the first electrode, and a charge-shift control section disposed between the charge-storing section and the charge transfer section to control the operation of shifting charges from the charge-storing section to the charge transfer section.

With a solid state image-sensing device embodying this invention, charges generated in the photoelectric conversion section are successively stored in a potential wall formed by the second surface potential-setting section. Where, therefore, the surface potential of that portion of the semiconductor substrate which faces the third surface potential-setting section is set at the third prescribed potential level by the third surface potential-setting section, then a stored charge is shifted to the charge transfer section in a relatively short and constant time.

This invention can be more fully understood from the following detailed description when taken in conjunction with the accompanying drawings, in which:

FIG. 6 is a sectional view of the present solid state image-sensing device taken along a line VI—VI in FIG. 5;

FIGS. 7 and 8 are potential profiles illustrating the operation of the present solid state image-sensing device of FIGS. 5 and 6;

FIGS. 9 to 11 are sectional views of the main parts of solid state image-sensing devices according to different embodiments of the invention which can achieve the same effect as the embodiment of FIGS. 5 and 6;

FIG. 13 is a sectional view of the present solid state image-sensing device taken along a line XIII—XIII in FIG. 12;

FIG. 14 is a potential profile illustrating the blooming-suppressing function of the present solid state image-sensing device of FIGS. 12 and 13; and FIG. 15 is a modification of the present solid state image-sensing device of FIG. 11.

Figure 5:
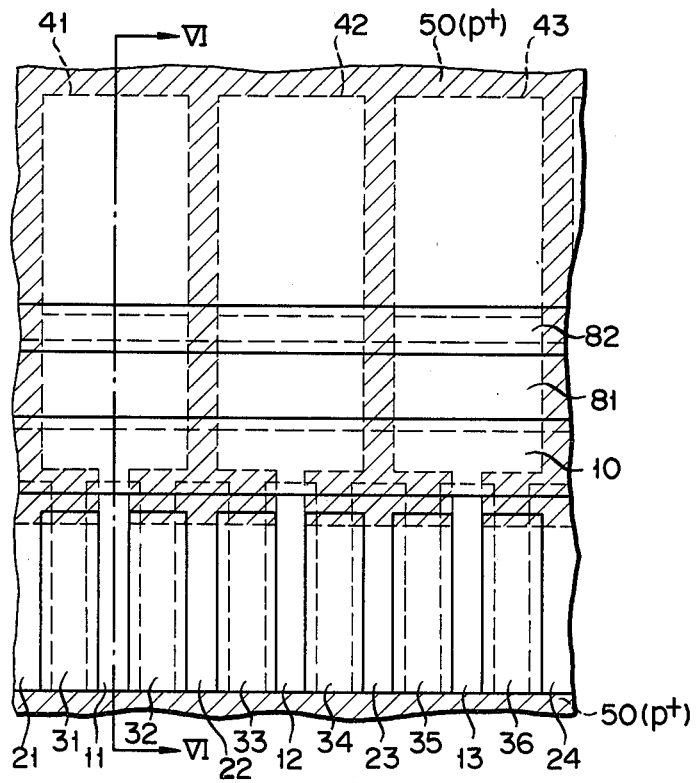
FIG. 5 is a plan view of the main part of a solid state image-sensing device according to one embodiment of this invention.

FIGS. 5 and 6 schematically show the main part of a solid state image-sensing device according to one embodiment of this invention. Like the prior art solid state image-sensing device of FIGS. 1 and 2, the present solid state image-sensing device of FIGS. 5 and 6 includes p-n junction type photodiodes or photoelectric conversion sections 41 to 43 constituted by, for example, n conductivity type semiconductor regions 4 formed in parallel in the surface area of a semiconductor substrate 2 of, for example, p conductivity type, and a charge transfer region 6 formed of an n-type semiconductor region which extends in the surface area of the substrate 2 in parallel with a line along which the photoelectric conversion sections 41 to 43 are arranged. A charge-storing electrode 81 is formed insulatively on the surface of that portion of the semiconductor substrate 2 which is located apart from and between the photoelectric conversion sections 41 to 43 and the charge transfer region 6. Further, a barrier electrode 82 extending lengthwise of the substrate 2 is so formed in an insulated state as to overlap on one lateral side of a charge-storing electrode 81 and those sides of the photoelectric conversion sections 41 to 43 which face the lateral side of the charge-storing electrode 81. A charge shift control electrode 10 extending similarly lengthwise of the substrate 2 is so formed as to insulatively overlap the other lateral side of the charge-storing electrode 81 and that side of the charge transfer region 6 which faces the charge-storing electrode 81. The solid state image-sensing device of this invention shown in FIGS. 5 and 6 further includes charge transfer electrodes 11 to 13 insulatively formed on the charge transfer region 6 in alignment with the center of the photoelectric conversion sections 41 to 43, charge transfer electrodes 21 to 24 arranged apart from and alternately with the charge transfer electrodes 11 to 13 and charge transfer electrodes 31 to 36 which are respectively so arranged as to insulatively overlap the mutually facing sides of every two adjacent ones of the charge transfer electrodes 11 to 13 and 21 to 24. The charge transfer electrodes 11, 22, 12, 23, 13 and 24 are respectively electrically connected to the charge transfer electrodes 31 to 36 in the order mentioned. For example, those portions of the charge transfer region 6 which lie under the charge transfer electrodes 31 to 36 are formed to have a high impurity concentration, and the charge transfer electrodes 11 to 13, 21 to 24 and 31 to 36 constitute the well-known 2-phase driven type charge transfer device together with the charge transfer region 6. Such a 2-phase driven type charge transfer device is known well in the art and the detailed description thereof is omitted.

A p-type region 50 formed at a high impurity concentration is used as a channel stop for preventing signal charges from leaking to a region outside a prescribed channel. As indicated in hatchings in FIG. 5, the channel stop 50 defines channels from the photoelectric conversion sections 41 to 43 to those portions of the charge transfer region 6 which lie below the charge transfer electrodes 11 to 13, and also defines another channel extending along the charge transfer region 6.

Description is now given of the operation of a solid state image-sensing device according to one embodiment of this invention shown in FIGS. 5 and 6 with reference to FIGS. 7 and 8 indicating the potential profiles of the image-sensing device.

The charge-storing electrode 81 is impressed with a higher voltage than that which is supplied to the barrier electrode 82. Potential wells, one of which is indicated by reference numeral 81A in FIG. 7, are respectively formed in those portions of the semiconductor substrate 2 which face the photoelectric conversion sections 41 to 43 and reside below the charge-storing electrode 81 and are separated from one another by the channel stops 50.

In a charge-storing step, the voltage of the charge-shift control electrode 10 is held at the substrate potential. The surface potential of that portion of the substrate 2 which faces the charge-shift control electrode 10 is held at a level substantially equal to the surface potential of the channel stop 50 is indicated in a solid line 10C in FIG. 7. Under this condition, the channel stop 50 and that portion of the substrate 2 which lies below the charge-shift control electrode 10 jointly define the photoelectric conversion sections 41 to 43 and regions including those of independently formed potential wells which face the photoelectric conversion sections 41 to 43 below the barrier electrode 82. Under the above-mentioned condition, the channel stop 50 and that portion of the substrate 2 which faces the photoelectric conversion section 41 and resides below the charge-shift control electrode 10 cooperate to enclose, for example, the photoelectric conversion section 41 and that portion of the substrate 2 which faces the photoelectric conversion section 41 and resides below the charge-storing electrode 81.

With the embodiment of FIGS. 5 and 6, charges or electrons produced in the charge-storing step in accordance with amounts of light received by the photoelectric conversion sections 41 to 43 are not retained in the photoelectric conversion sections 41 to 43, but are shifted to the corresponding wells. For example, charges or electrons generated in, for example, the photoelectric conversion section 41 are shifted to the potential well 81A as indicated by an arrow 7A in FIG. 7. Namely, all the charges or electrons produced in the photoelectric conversion section 41 in amounts corresponding to those of light beams which are received by the photoelectric conversion section 41 are stored in the potential well 81A. Charges produced in the other photoelectric conversion sections 42 and 43 are likewise stored in the corresponding potential wells.

In the charge shift step, the charge-shift control electrode 10 is impressed with a higher voltage than that which is supplied to the charge-storing electrode 81. As a result, the surface potential of that portion of the substrate 2 which faces the charge-shift control electrode 10 is set at a level, as indicated in a solid line 10D in FIG. 8, which is higher than the surface potential of that portion of the substrate 2 which faces the charge-storing electrode 81 and lower than the surface potential of the n-type charge transfer region 6. Accordingly, the charges or electrons which are generated in the photoelectric conversion sections 41 to 43 and stored in the corresponding potential wells are shifted to those below portions of the charge transfer region 6 which lie below the charge transfer electrodes 11 to 13. For example, charges or electrons produced in the photoelectric conversion section 41 and stored in the potential well 81A are shifted, as indicated by an arrow 8A in FIG. 8, to that portion of the charge transfer region 6 which lies below the charge transfer electrode 11.

Where all the charges generated in the photoelectric conversion sections are shifted to the corresponding sections of the charge transfer region, then the charge-shift control electrode 10 is brought back to the substrate potential to make ready for the succeeding charge-storing step. The charge transfer electrodes 11 to 13, 21 to 24 and 31 to 36 are impressed with prescribed voltages in order to transfer the charges shifted to the charge transfer region 6 in a direction in which the charge transfer electrodes 11 to 13, 21 to 24 and 31 to 36 are arranged.

With the above-mentioned solid state image-sensing device according to one embodiment of this invention, all the charges generated in the photoelectric conversion section in the charge-storing step are temporarily stored in the potential wells formed below the charge-storing electrode 81. During the following charge shifting step, the stored charges are all shifted to the charge transfer region 6. In this case, the length of time required for all the charges stored in the potential wells to be shifted to the charge transfer region 6 is defined by the width of the charge-storing electrode 81. It is generally known that the time of charge transfer is proportional to substantially the square of the length of a charge-storing region which extends in the direction in which a charge is transferred.

Figure 1:
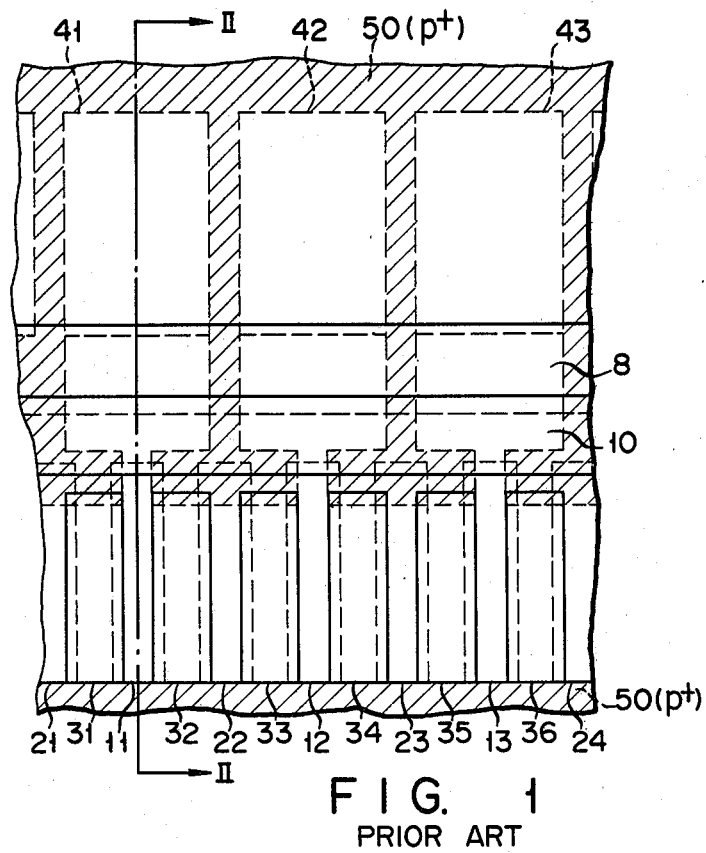
FIG. 1 is a plan view of the main part of the prior art solid state image-sensing device.
Figure 2:
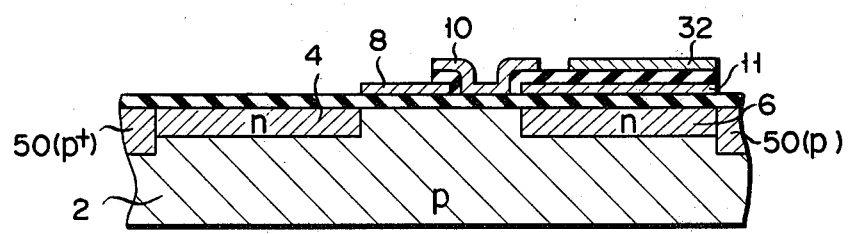
FIG. 2 is a sectional view of the prior art solid state image-sensing device taken along a line II—II in FIG. 1.
Figure 3:
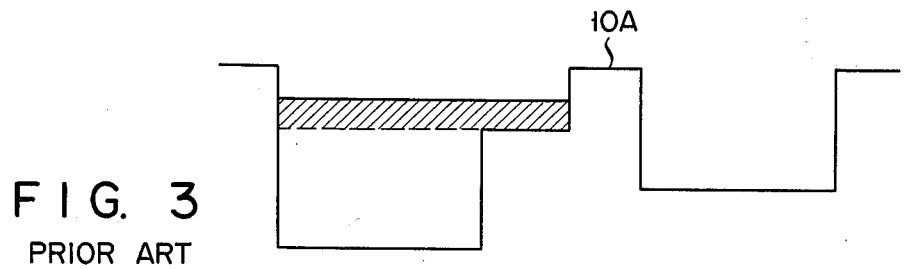
FIGS. 3 and 4 are potential profiles illustrating the operation of the prior art solid state image-sensing device of FIGS. 1 and 2.
Figure 4:
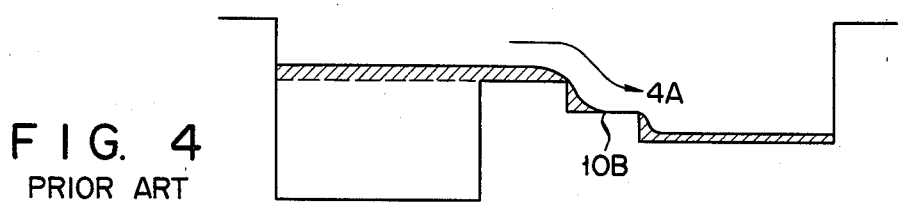

The width of the charge-storing electrode 81 used in the aforesaid embodiment of this invention can be made much shorter than the sum of the width of the n-type semiconductor region 4 and that of the charge-storing electrode 8 provided in the prior art solid state image-sensing device of FIGS. 1 and 2. Therefore, with the solid state image-sensing device according to the embodiment of the invention shown in FIGS. 5 and 6, a time of charge transfer can be made prominently shorter than in the prior art solid state image-sensing device.

Description is now given with reference to FIG. 9 of a solid state image-sensing device according to another embodiment of this invention. This second embodiment of FIG. 9 has substantially the same arrangement as the first embodiment of FIGS. 5 and 6, except that the charge-storing electrode 81 and barrier electrode 82 of the first embodiment are replaced by an electrode 83. This electrode 83 is formed of an electrode section 83-1 corresponding to the charge-storing electrode 81 of the first embodiment and an electrode section 83-2 which is integrally formed with the first mentioned electrode section 83-1 and spaced farther from the substrate 2 than the first mentioned electrode section 83-1. Where a prescribed voltage is impressed on the electrode 83, then the surface potential of that portion of the substrate 2 which faces the electrode section 83-1 is set at a higher level than the surface potential of that portion of the substrate 2 which faces the electrode section 83-2. The second embodiment of FIG. 9 has the same effect as the first embodiment of FIGS. 5 and 6.

Figure 10:
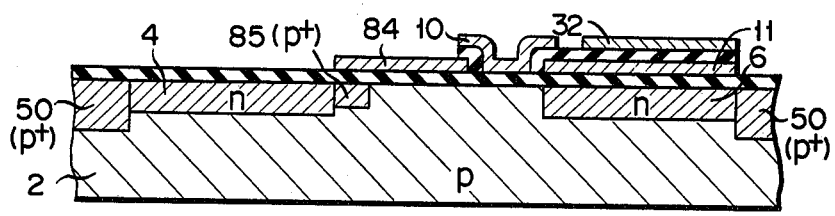

Description is now given with reference to FIG. 10 of a solid state image-sensing device according to a third embodiment of this invention. With this third embodiment, the electrodes 81, 82 of the first embodiment of FIGS. 5 and 6 are replaced by a single electrode 84. The third embodiment of FIG. 10 has substantially the same arrangement as the first embodiment of FIGS.

5 and 6, except that a p+-type region 85 having an impurity concentration higher than the substrate 2 and lower than the channel stop region 50 is formed in the surface area of that portion of the substrate 2 which lies adjacent the n-type region 4. Where the electrode 84 is impressed with a prescribed voltage, then the surface potential of the p+-type region 85 and the surface potential of that portion of the substrate 2 which faces the electrode 84 have the same potential profile as that shown in FIG. 7. After all, the third embodiment of FIG. 10 has the same effect as the first embodiment of FIGS. 5 and 6.

Figure 11:
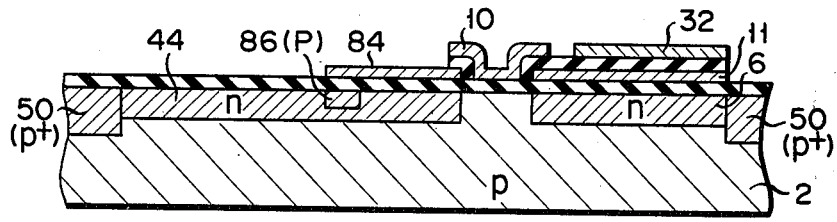

Description is now given with reference to FIG. 11 of a solid state image-sensing device according to a fourth embodiment of this invention. This fourth embodiment of FIG. 11 has substantially the same arrangement as the third embodiment of FIG. 10 except that the p+-type region 85 of FIG. 10 is replaced by a p-type region 86; and the n-type semiconductor region 4 used in the third embodiment of FIG. 10 is replaced by an n-type semiconductor region 44, which extends at one end to the underside of the border region of the electrodes 10 and 84, and is so formed as to surround a p-type region 86. Where a prescribed voltage is impressed on the electrode 84, then the surface potential of the p-type region 86 and the surface potential of that portion of the n-type semiconductor region 44 which faces the electrode 84 have such a potential profile as that illustrated in FIG. 7. After all, therefore, the fourth embodiment of FIG. 11 has the same effect as the first embodiment of FIGS. 5 and 6.

Figure 12:
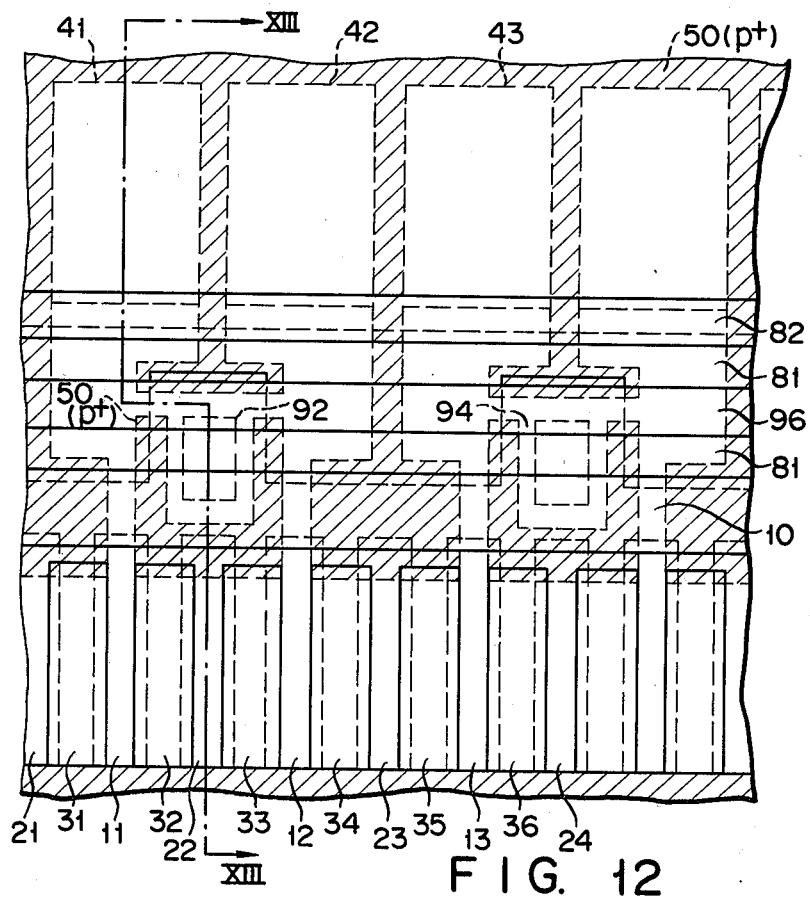
FIG. 12 is a plan view of the main part of a solid state image-sensing device according to still another embodiment of the invention which can suppress blooming phenomenon.

Description is now given with reference to FIGS. 12 and 13 a solid state image-sensing device aaccording to a fifth embodiment of this invention. This fifth embodiment has substantially the same arrangement as the first embodiment of FIGS. 5 and 6, except that those portions of the electrode 81 which face the electrodes 22, 24 shown in FIG. 12 are notched; n+-type regions 92, 94 acting as charge drain regions are formed in those surface areas of the semiconductor substrate 2 which face the notches of the electrode 81; and a blooming control electrode 96 is formed to cover part of the n+-type regions 92, 94 and part of the electrode 81.

With the fifth embodiment of FIGS. 12 and 13, different prescribed bias voltages are impressed on the electrodes 81, 82 and 96 and n+-type regions 92, 94. Thus, as shown in FIG. 14, the surface potential $\phi A$ of that portion of the semiconductor substrate 2 which lies below the control electrode 96 is made lower than the surface potential $\phi B$ of that portion of the semiconductor substrate 2 which lies below the charge storing electrode 81, and equal to or higher than the surface potential $\phi C$ of that portion of the semiconductor substrate 2 which lies below the barrier electrode 82. The surface potential $\phi D$ of the n+-type regions 92, 94 is made higher than the surface potential of that portion of the semiconductor substrate 2 which lies below the electrode 96.

Charges generated in the photoelectric conversion region during the charge-storing step are shifted through that portion of the semiconductor substrate 2 which lies under the barrier electrode 82 to be stored in that surface area of the semiconductor substrate 2 which lies below the charge-storing electrode 81. Where, at this time, an intense light is irradiated on the photoelectric conversion region 4, and a large amount of charges are generated therein, then all the charges generated can not be stored in a region below the charge-storing electrode 81. As a result, the overflowing portion of the generated charges are conducted through that portion of the semiconductor substrate 2 which lies below the blooming control electrode 96 and runs into the n+-type region 92. The charge thus carried into the n+-type region 92 is released to the outside through a voltage line (not shown) connected to the n+-type region 92. Where, with the fifth embodiment of FIGS. 12 and 13, a light having a higher intensity than a certain level is irradiated on the photoelectric conversion region 4, then excessive charges overflowing from a charge-storing region are released to the outside through the n+-type regions 92, 94, thereby suppressing the occurrence of the so-called blooming phenomenon which results from the intrusion of excessive charges into a region which should be saved from such undesirable intrusion.

This invention has been described with reference to the foregoing embodiments. However, the invention is not limited to those embodiments. For instance, it is possible to replace the n-type semiconductor region 44 of FIG. 11 by an n-type semiconductor region 4 as shown in FIG. 15 and form an n-type region 87 in that surface area of the semiconductor substrate 2 which lies below the electrode 84 and is separated from the n-type semiconductor region 4. This arrangement also ensures the same effect as the foregoing embodiments. Further, the p-type semiconductor substrate may be replaced by an n-type semiconductor substrate. In this case, however, it is necessary to reverse the conductivity of other semiconductor regions and the polarity of bias voltages. Further, the embodiments of FIGS. 9 to 11 may be rearranged to carry out the blooming-preventing function described with reference to FIGS. 12 to 14.

What is claimed is:

1. A solid state image-sensing device which comprises:
    a semiconductor substrate of one conductivity type;
    a photoelectric conversion section including at least one semiconductor region having the opposite conductivity type as that of the semiconductor substrate and formed in the surface area of said semiconductor substrate;
    a charge transfer section formed apart from the photoelectric conversion section;
    a charge-storing section formed spatially between said photoelectric conversion section and said charge transfer section, and including a second semiconductor region integrally formed with the first semiconductor region of said photoelectric conversion section and having the opposite conductivity type as that of said semiconductor substrate, and a first electrode insulatively formed on said second semiconductor region;
    a charge-shifting section provided between said photoelectric conversion section and said charge-storing section to shift charges generated in said photoelectric conversion section to said charge-storing section, and including a third semiconductor region formed in said second semiconductor region in a position adjacent to said first semiconductor region and having the same conductivity type as said semiconductor substrate, and a second electrode insulatively formed on said third semiconductor region and in electrical connection with said first electrode; and
    a charge-shift control section disposed between said charge-storing section and said charge transfer section to control the operation of shifting charges from said charge-storing section to said charge transfer section.

2. A solid state image-sensing device according to any one of claims 1, which further comprises a charge drain section which is formed adjacent said charge-storing section to draw out those charges which are supplied from said photoelectric conversion section and are not stored in the charge-storing section in a charge-storing step.

3. A solid state image-sensing device comprising:
a semiconductor substrate of one conductivity type;
a photoelectric conversion section including at least one semiconductor region having the opposite conductivity type to that of said semiconductor substrate and being formed in the surface area of said semiconductor substrate;
a charge transfer section formed apart from said photoelectric conversion section;
a charge-storing section formed spatially between said photoelectric conversion section and said charge transfer section;
a charge-shifting section provided between said photoelectric conversion section and said charge-storing section to shift charges generated in said photoelectric conversion section to said charge-storing section;
a charge-shift control section disposed between said charge-storing section and said charge transfer section to control the operation of shifting charges from said charge-storing section to said charge transfer section; and
a charge drain section disposed in a position opposite to said charge-shifting section with respect to said charge-storing section and being formed adjacent to said storing section to draw out those charges which are supplied from said photoelectric conversion section and which are not stored in said charge-storing section in a charge-storing step.

4. A solid state image-sensing device according to claim 3, wherein the charge drain section includes a semiconductor region which is formed in that surface area of said semiconductor substrate which lies adjacent the charge-storing section with the same conductivity type as that of the first semiconductor region and at a higher impurity concentration than said first semiconductor region.

* * * * *